United States Patent [19]
Shiraishi

[11] Patent Number: 5,335,044
[45] Date of Patent: Aug. 2, 1994

[54] PROJECTION TYPE EXPOSURE APPARATUS AND METHOD OF EXPOSURE

[75] Inventor: Naomasa Shiraishi, Kawasaki, Japan

[73] Assignee: Nikon Corporation, Tokyo, Japan

[21] Appl. No.: 20,775

[22] Filed: Feb. 22, 1993

[30] Foreign Application Priority Data

Feb. 26, 1992 [JP] Japan .................................. 4-39754
May 26, 1992 [JP] Japan ................................. 4-132996

[51] Int. Cl.⁵ ............................................. G03B 27/42
[52] U.S. Cl. ......................................... 355/53; 355/67
[58] Field of Search .................................... 355/67, 53

[56] References Cited

U.S. PATENT DOCUMENTS

| | | | |
|---|---|---|---|
| 4,939,630 | 7/1990 | Kikuchi et al. | 362/268 |
| 4,988,188 | 1/1991 | Ohta | 355/53 |
| 5,144,362 | 9/1992 | Kamon et al. | 355/53 |
| 5,251,067 | 10/1993 | Kamon | 355/53 |
| 5,253,040 | 10/1993 | Kamon et al. | 355/53 |
| 5,264,898 | 11/1993 | Kamon et al. | 355/53 |

FOREIGN PATENT DOCUMENTS

61-91662 5/1986 Japan .
63-66553 3/1988 Japan .

OTHER PUBLICATIONS

The Japan Society of Applied Physics, "The 52nd Autumn Meeting, 1991", pp. 600–603.
Naomasa Shiraishi, et al, "New Imaging Technique for 64M-DRAM", SPIE vol. 1674, Optical/Laser Microlithography V (1992), pp. 741–752.

*Primary Examiner*—Monroe H. Hayes
*Attorney, Agent, or Firm*—Shapiro and Shapiro

[57] ABSTRACT

A projection type exposure apparatus comprises:
   a light source for radiating illumination light for exposure;
   an illumination optical system for irradiating with the illumination light a mask having a first pattern and a second pattern extending perpendicular to each other;
   the illumination optical system having a fly eye type integrator for forming a plurality of images of the light source on or near a Fourier transform plane to a pattern surface of the mask;
   a projection optical system for projecting an image of the patterns of the mask on a photosensitive substrate; and
   a stop member for restricting passage of the illumination light through the Fourier transform plane to an annular zone with center on an optical axis of the illumination optical system and for partially shielding or reducing the plurality of images of the light source such that a number of images of the light source contributing to a resolution of the first pattern is substantially identical with that of images of the light source contributing to a resolution of the second pattern in the annular zone.

20 Claims, 11 Drawing Sheets

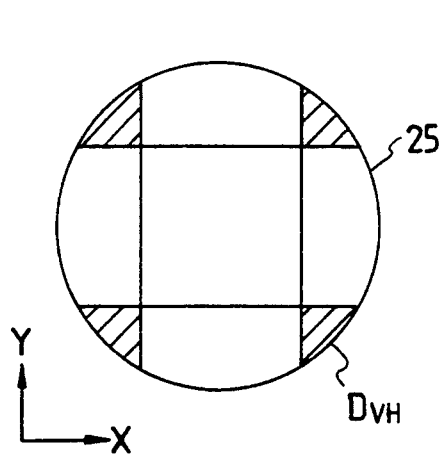
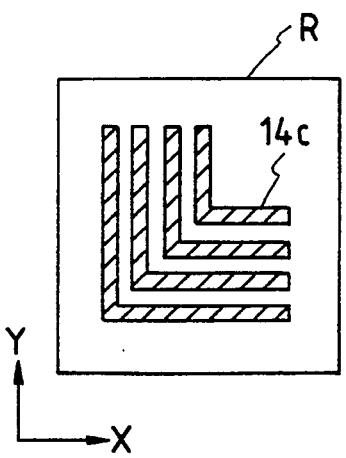
FIG. 9A    FIG. 9B
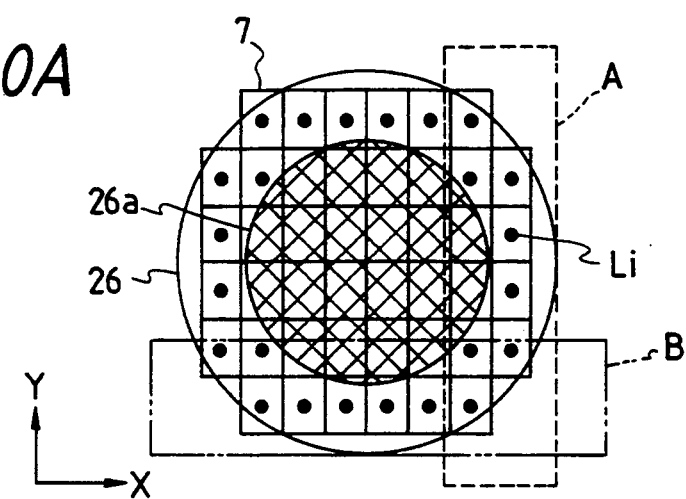
FIG. 10A
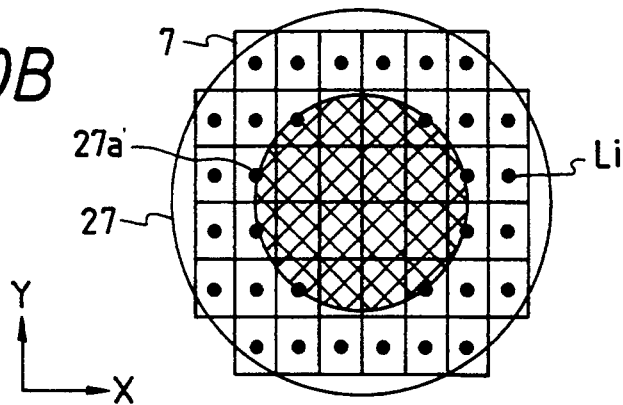
FIG. 10B

PROJECTION TYPE EXPOSURE APPARATUS AND METHOD OF EXPOSURE

BACKGROUND OF THE INVENTION

1. Field of the Invention

The present invention relates to a method of exposure and a projection type exposure apparatus for forming a fine pattern for semiconductor integrated circuits, liquid crystal devices, or the like.

2. Related Background Art

Formation of circuit pattern for semiconductor usually requires a process of the so-called photolithography. This process employs a method of copying a reticle (mask) pattern on a substrate such as a semiconductor wafer. The substrate is coated with a photosensitive photoresist, and a circuit pattern is copied on the photoresist according to an illumination light image, that is, a pattern of transparent portion in the reticle pattern. In a projection type exposure apparatus (for example a stepper), an image of circuit pattern drawn on the reticle is projected through a projection optical system onto the substrate (wafer) to form an image thereon.

There is an optical integrator (such as a fly eye type integrator, a rod type integrator, and an optical fiber) employed in an illumination optical system for illuminating the reticle to make uniform an intensity distribution of illumination light irradiating the reticle. The fly eye type integrator (fly eye lens) is a group of lenses, in which several ten's unit lens elements having the same shape are arranged in a plane normal to an optical axis of the illumination optical system. When the intensity distribution is made uniform using the fly eye lens, there are a Fourier transform relation between a reticle side focal plane (exit side focal plane) and a reticle surface (pattern surface) and another Fourier transform relation between the reticle side focal plane and a light source side focal plane (entrance side focal plane). Accordingly, an imaging relation (conjugate relation) is established between the pattern surface of the reticle and the light source side focal plane of the fly eye lens (more precisely each light source side focal plane of unit lens element in the fly eye lens). Thus, the illumination light beams from the respective lens elements (secondary light source images) in the fly eye lens are added (superimposed) through a condenser lens on the reticle to be averaged, whereby good illuminance evenness may be attained on the reticle.

Incidentally, the reticle side focal plane (exit plane) of the fly eye lens is an optical Fourier transform plane to the pattern surface of the reticle, and each position of lens element in the exit plane corresponds to an incident angle (more precisely a sine of the angle) of an illumination beam from said each element into the pattern surface of the reticle. Thus, if an aperture stop ($\sigma$ stop) is located near the exit plane, a range of incident angle of illumination light into the reticle pattern would be limited. An aperture shape of the aperture stop was conventionally a circular transparent portion with center on the optical axis. A coherence factor ($\sigma$ value) is generally defined as a ratio of incident angle range of illumination light into the reticle pattern, which is determined by a radius of the circular aperture, to reticle side numerical aperture of the projection optical system.

Recent attention has been drawn to the annular zone illumination method (as described in Japanese Laid-open Patent Application No. 61-91662) and to the modified light source method (as presented at the scientific lecture in Fall 1991, Society of Applied Physics, Japan) for improving the resolution and the focal depth. In the annular zone illumination method, a stop having an annular transparent portion (as will be referred to an annular zone stop) is located near the optical Fourier transform plane to the reticle pattern in the illumination optical system, for example, near the exit plane of the fly eye lens, to shield illumination beams near the optical axis of the illumination optical system. In the modified light source method, a stop having at least one transparent portion eccentric to the optical axis of the illumination optical system (as will be referred to as a modified light source stop) is located near the exit plane of the fly eye lens to illuminate the reticle pattern with illumination beams being inclined thereto. Inventors filed patent applications, for example, U. S. Serial No. 791,138 (Nov. 13, 1991) and U. S. Ser. No. 847,030 (Apr. 15, 1992) to disclose the modified light source method.

The fly eye lens is composed of a plurality of square or rectangular lens elements arranged in matrix. The projection type exposure apparatus normally employs the Kohler illumination, in which images of a light source such as a mercury lamp are formed on the exit plane of the fly eye lens. Thus, the secondary light source on the exit plane of the fly eye lens is composed of discrete light source images each being concentrated around the central area of each lens element, which means that the entire exit plane is not emitting uniform light. If the $\sigma$ stop is provided for such a discrete secondary light source, some of images of secondary light source overlap an edge of the stop (a boundary between a light transmitting portion and a light shielding portion), which will be an unstable factor such as a dispersion of illumination light amount. A method effective to eliminate such unstable factor is for example what is disclosed in U.S. Pat. No. 4,939,630, in which an aperture shape of the $\sigma$ stop follows an arrangement of lens elements constituting the fly eye lens. That is, the boundary between the light transmitting portion and the light shielding portion is substantially coincident with a border line between the elements. The aperture shape may be also determined to follow the arrangement of lens elements in each of the annular zone stop and the modified light source stop. Further, U.S. Pat. No. 4,939,630 discloses so-called double fly eye lenses, which are two sets of fly eye lens arranged in series.

A typical shape of pattern area (area illuminated with illumination light) on the reticle is rectangular, matching with the shape of semiconductor chip to be formed on the wafer. The respective lens elements in the fly eye lens thus usually have a rectangular cross section. This inevitably makes an arrangement pitch on the shorter side of rectangle (lens element) different from that on the longer side in the fly eye lens. This in turn results in formation of discrete images of secondary light source (or tertiary light source in double fly eye lenses) on the exit plane of the fly eye lens at different longer side and shorter side pitches.

No study is made in U.S. Pat. No. 4,939,630 as to optimization of aperture shape of $\sigma$ stop in relation with the arrangement of lens elements (light source images). Nothing was studied about optimization of aperture shape in relation to the arrangement of lens elements, either, in the annular zone stop disclosed in Japanese Laid-open Patent Application No. 61-91662, or, in the modified light source stop as presented at the '91 Fall scientific lecture, Society of Applied Physics, Japan. Therefore, there has been such a problem that two types of pattern extending perpendicular to each other (in the directions of the longer side and the shorter side of the lens elements), which will be referred to as a vertical pattern and a horizontal pattern, would form respective replication images in line widths (light amount distributions) different from each other. A further problem was found in the modified light source stop that a focal depth of the vertical pattern is greatly different from that of the horizontal pattern.

SUMMARY OF THE INVENTION

It is an object of the present invention to provide a method of exposure and a projection type exposure apparatus enabling a high quality projection exposure without a difference in line width or without a difference in focal depth between the vertical pattern and the horizontal pattern.

A first projection type exposure apparatus according to the present invention is so arranged that a fly eye type integrator (7) is provided for forming a plurality of images (Li) of a light source on or near a Fourier transform plane to a pattern surface of a mask (R) in an illumination optical system and that a stop member (annular zone stop 30) is provided for restricting passage of the illumination light through the Fourier transform plane to an annular zone with center on an optical axis (AX) of the illumination optical system and for partially shielding or reducing the plurality of images of the light source such that a number of images of the light source contributing to a resolution of a first pattern (vertical pattern 14V) is substantially identical with that of images of the light source contributing to a resolution of a second pattern (horizontal pattern 14H) in the annular zone.

A second projection type exposure apparatus according to the present invention is so arranged that a fly eye type integrator (7) is provided and that a stop member ($\sigma$ stop 9) is provided for restricting passage of the illumination light through the Fourier transform plane to a partial region around an optical axis (AX) of the illumination optical system and for partially shielding or reducing a plurality of images of a light source such that a number of images of the light source contributing to a resolution of a first pattern (14V) distributed on a periphery of the partial region is substantially identical with that of images of the light source contributing to a resolution of a second pattern (14H) distributed on a periphery of the partial region.

A third projection type exposure apparatus according to the present invention is so arranged that a fly eye type integrator (7) is provided and that a stop member (modified light source stop 40, 41, or 8) is provided for restricting passage of illumination light through a Fourier transform plane to local regions eccentric to an optical axis (AX) of an illumination optical system and for partially shielding or reducing a plurality of images of a light source such that a number of images of the light source contributing to a resolution and a focal depth of a first periodic pattern (14V) is substantially identical with that of images of the light source contributing to a resolution and a focal depth of a second periodic pattern (14H) in the local regions (light transmitting portions).

A fourth projection type exposure apparatus according to the present invention is so arranged that a fly eye type integrator (7) is provided and that a stop member (modified light source stop 8A, 8B, 8C) is provided for partially shielding or reducing a plurality of images of a light source such that a distribution of light amount from the plurality of images of the light source takes a maximum for each of local regions eccentric to an optical axis (AX) of an illumination optical system and that when an XY rectangular coordinate system is set with coordinate origin on the optical axis of the illumination optical system and in a Fourier transform plane, a barycenter of the distribution of light amount in each local region (light transmitting portion) takes X, Y coordinates, absolute values of which are substantially equal to each other, on the XY coordinate system.

As described, the number of light source images contributing to the resolution of the first pattern is substantially equal to the number of light source images contributing to the resolution of the second pattern in the first to third projection type exposure apparatuses, and the absolute value of X coordinate of barycenter of light amount distribution is substantially equal to the absolute value of Y coordinate of barycenter of light amount distribution in one local region in the fourth projection type exposure apparatus, whereby the first pattern and the second pattern may have respective replication images with substantially identical line width (light amount distribution). Especially in the third and the fourth projection type exposure apparatuses, the focal depth of the first pattern may be substantially equal to that of the second pattern.

Further in the third projection type exposure apparatus, a ratio of number of light source images contributing to the focal depth of the first periodic pattern to number of other light source images is made substantially identical with a ratio of number of light source images contributing to the focal depth of the second periodic pattern to number of other light source images in each of the local regions. In other words, the light source images effective only for the first periodic pattern to have an increased focal depth are identical in number with the light source images effective only for the second periodic pattern to have an increased focal depth, which are used together with light source images effective for the first periodic pattern and the second periodic pattern both to have respectively increased focal depths. Also, in the fourth projection type exposure apparatus, using the light source images effective for the first periodic pattern and the second periodic pattern both to have respectively increased focal depths and at least one light source image other than the effective light source images in each of the focal regions, the absolute value of X coordinate of barycenter of light amount distribution is made substantially identical with that of Y coordinate of barycenter of light amount distribution in each local region. This arrangement permits the first periodic pattern and the second periodic pattern to have respective focal depths substantially equal to each other as both increased, minimizing a light amount loss caused by the stop member and degradation of illuminance evenness on the reticle (or wafer).

A first method of exposure according to the present invention comprises positioning a fly eye type integrator (7) for forming a plurality of images (Li) of a light source on or near a Fourier transform plane to a pattern surface of a mask (R) in an illumination optical system for irradiating the mask with illumination light (3) from the light source (1). The first method of exposure further comprises shielding or reducing at least one image of the light source located in a periphery of a partial region around an optical axis (AX) of the illumination optical system, whereby a number of images of the light source contributing to a resolution or a focal depth of a first pattern (14V) is made substantially identical with that of images of the light source contributing to a resolution or a focal depth of a second pattern (14H). This permits the first pattern and the second pattern to have respective line widths (light amount distributions) of replication image substantially equal to each other in either of the normal illumination method, the annular zone illumination method, and the modified light source method. Especially in the modified light source method, the focal depth of the first pattern may be made substantially equal to that of the second pattern.

A second method of exposure according to the present invention is effective on the condition of use of the modified light source method, in which when an XY rectangular coordinate system is set with coordinate origin on the optical axis (AX) of the illumination optical system and in a Fourier transform plane to a pattern surface of a mask (R) in the illumination optical system, absolute values of X, Y coordinates of a barycenter of light amount distribution in each of local regions (light transmitting portions 8a–8d) are substantially equal to each other. This permits the first periodic pattern and the second periodic pattern to have respective focal depths substantially equal to each other as both increased.

BRIEF DESCRIPTION OF THE DRAWINGS

FIG. 7A, FIG. 7B, FIG. 8A, FIG. 8B, FIG. 9A, and FIG. 9B are drawings to respectively illustrate fundamentals of the first embodiment;

FIG. 10A and FIG. 10B are drawings to show a construction of a conventional annular zone stop;

DESCRIPTION OF THE PREFERRED EMBODIMENTS

Figure 1:
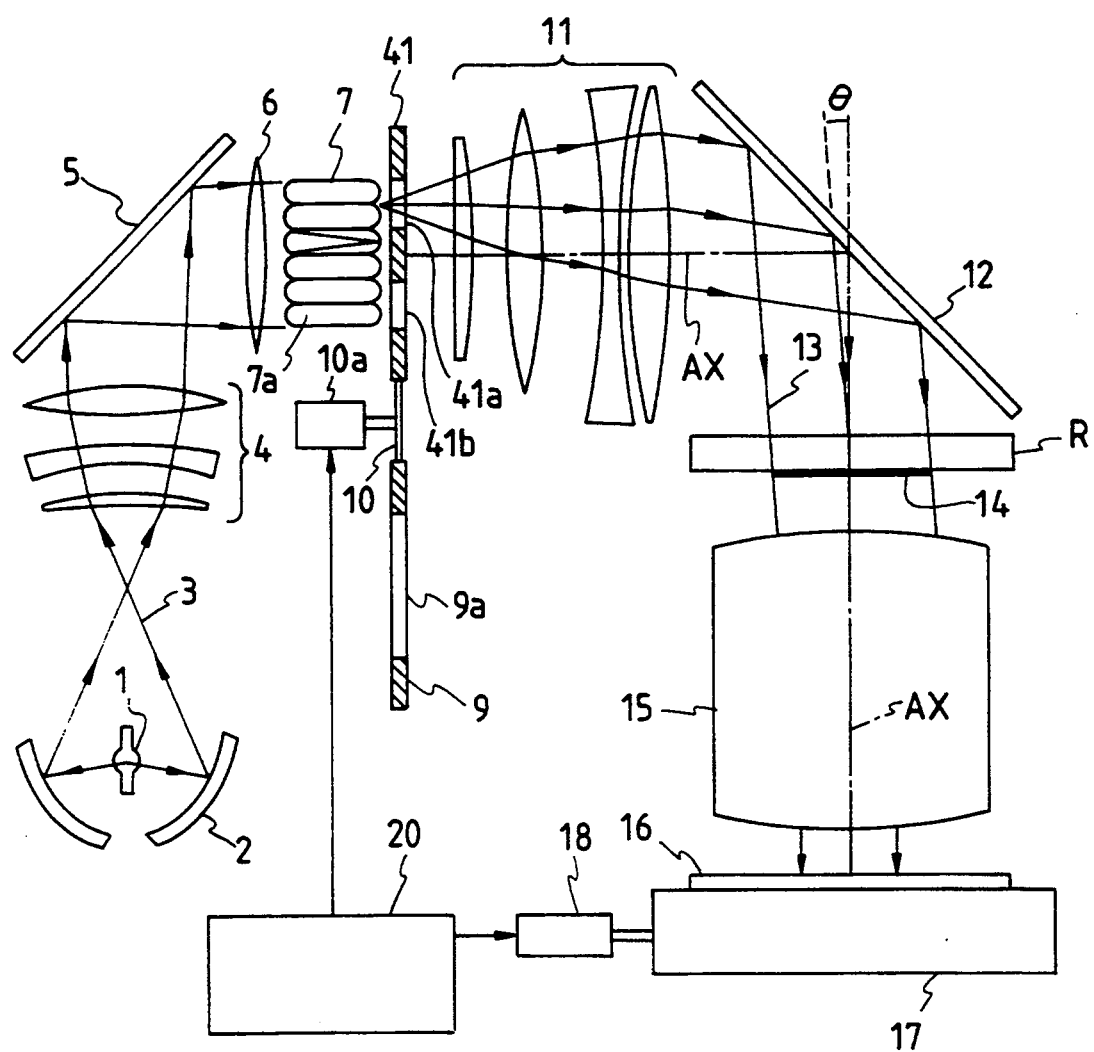
FIG. 1 is a drawing to show a scheme of a projection type exposure apparatus in an embodiment of the present invention.

FIG. 1 shows a schematic construction of a projection type exposure apparatus in an embodiment according to the present invention. A light source 1, for example a mercury lamp, emits illumination light beams 3. The emitted illumination light beams 3 are reflected and converged by an elliptic mirror 2, and the converged beams pass through an input lens system 4, 6 via a bending mirror 5 therein then to enter a fly eye lens 7 in the form of parallel rays. Each incident side plane of plural lens elements 7a constituting the fly eye lens 7 is conjugate (in imaging relation) with a pattern surface of a reticle R. Images (secondary light source) of the light source 1 are formed on exit side planes of respective lens elements 7a, and the exit side plane of the fly eye lens 7 is in optical relation of Fourier transform with the pattern surface of the reticle R. A stop member 41 is disposed near the exit plane of the fly eye lens 7 in the present embodiment. The details of shape of the stop member 41 will be described later. The fly eye lens 7 may be of a type in which the images of the light source 1 are formed on a plane distant at a predetermined distance in the direction of optical axis AX from the exit planes of the respective lens elements 7a. The stop member 41 is incorporatedly secured together with a stop member 9 to a holding member (for example a turret plate or slider) 10, which is located in an illumination optical path as exchangeable through a drive system 10a. The number (type) of stops fixed on the holding member 10 may be arbitrary, as being arranged for example in the form of turret.

Illumination beams 13 having passed through the stop member 41 (light transmitting portions 41a, 41b) further pass through a condenser lens group 11 and via a mirror 12 then to illuminate a pattern 14 on the reticle R. Light passing and diffracted through the pattern 14 is converged by a projection optical system 15 to form an image of the pattern 14 on a wafer 16. The wafer 16 is placed on a stage 17, which is two-dimensionally movable through a motor 18.

There is the optical relation of Fourier transform between the reticle pattern 14 and the exit plane of the fly eye lens 7 in FIG. 1, so that the stop 41 also has a substantial relation of Fourier transform with the reticle pattern 14. Accordingly, a position of either one of the light transmitting portions 41a, 41b in the plane of the stop 41 corresponds to an incident angle 8 of the illumination beam 13 into the reticle pattern 14.

A main control system 20 controls the driving system 10a to locate (set) a most suitable (optimum) stop for the reticle pattern 14 in the illumination optical path, based on the type of the reticle, fineness degree (line width, pitch) of the pattern, and a periodicity of the pattern, while totally controlling the entire apparatus. The main control system 20 reads a bar code pattern on the reticle R through a bar code reader, which is not shown, to set an optimum stop based upon the information as read. The bar code pattern may include an optimum stop for the reticle pattern. Alternatively, storing (or preliminarily inputting) names of reticle and illumination conditions therefor, the main control system 20 compares a name of reticle written in the bar code pattern with the stored contents to determine the optimum illumination conditions for the reticle pattern and then to select (set) a stop most suitable for the reticle pattern satisfying the determined conditions.

Figure 6:
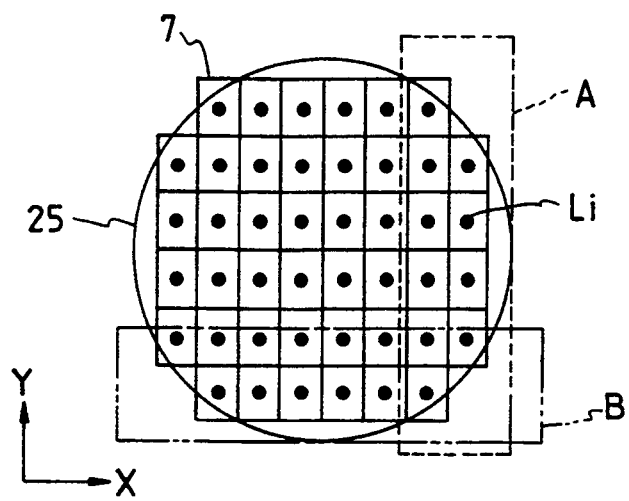
FIG. 6 is a drawing to show a construction of a conventional σ stop.

There will be described a stop member employed in a conventional apparatus, referring to FIG. 6, before the description of details of preferable stop members used in the apparatus of FIG. 1. FIG. 6 is a view of the exit side plane of the fly eye lens 7 as seen from the reticle side (along the optical axis of the illumination optical system). As seen in FIG. 6, the fly eye lens 7 is composed of plural rectangular lens elements 7a, eight elements in the horizontal direction (in the X direction) and six elements in the vertical direction (in the Y direction) on the sheet plane of the drawing, (excluding four corner lens elements), which is an assembly of forty four lens elements. An image Li of the light source 1 is formed at the central area of each element 7a (as shown by a dot in FIG. 6). A normal (conventional) circular aperture stop ($\sigma$ stop having a circular aperture) 25 is set to the fly eye lens 7 as so arranged in FIG. 6. The region outside the circle of the circular aperture stop 25 is a light shielding portion, though not shown.

Ten elements (light source images Li) in region A (encircled by a broken line) in FIG. 6 are especially effective to resolve a fine pattern formed to extend in the Y direction on the reticle R (as will be referred to as a vertical pattern). On the other hand, fourteen lens elements (light source images) in region B (encircled by an alternate long and two short dashes line) are effective to resolve a fine pattern formed to extend in the X direction on the reticle R (as will be referred to as a horizontal pattern). Further, the light source images Li in region A are noneffective (not to contribute) to resolve the horizontal pattern, and the light source images Li in region B are noneffective to resolve the vertical pattern. This will be further described in more detail referring to FIGS. 7A and 7B and FIGS. 8A and 8B.

Figure 7A:
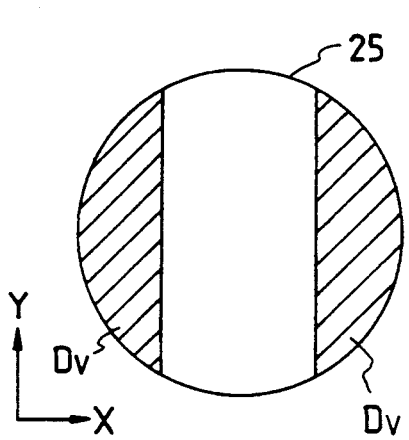
Figure 7B:
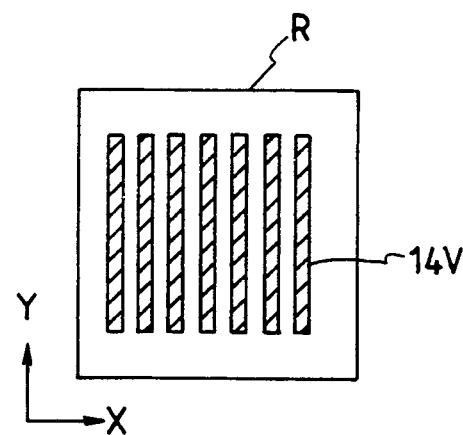
Figure 8A:
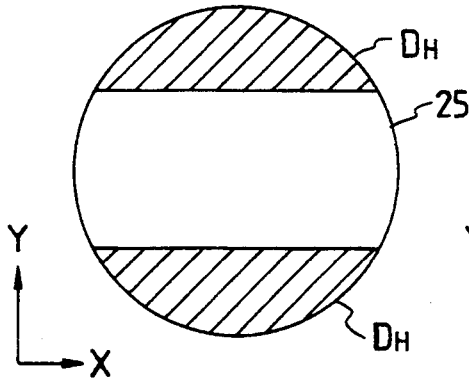
Figure 8B:
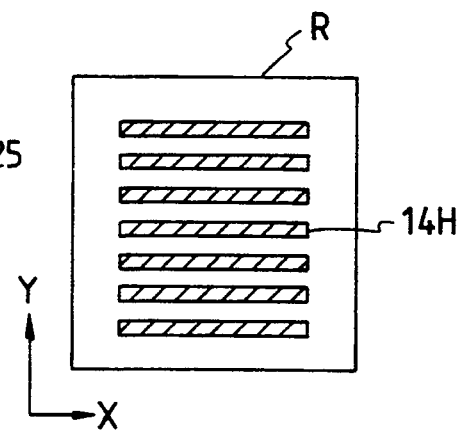

In FIG. 7A, two partial regions (hatched portions) $D_v$ (which correspond to region A, and more precisely which are light source images in the regions $D_v$) within the stop 25 are effective for the vertical pattern 14V as shown in FIG. 7B. Also, two partial regions (hatched portions) $D_H$ (corresponding to region B) in FIG. 8A are effective for the horizontal pattern 14H as shown in FIG. 8B. Further, in case that a reticle pattern 14c includes both vertical and horizontal patterns as shown in FIG. 9B, especially effective therefor are four partial regions (hatched portions) $D_{VH}$ (light source images inside $D_{VH}$) included in both regions $D_V$ in FIG. 7A and regions $D_H$ in FIG. 8A.

The conventional circular aperture stop 25 as shown in FIG. 6, however, has ten light source images (secondary light source) Li included in region A and fourteen light source images included in region B. As a result, a number of light source images contributing to formation (resolution) of the vertical pattern, twenty in total of addition of ten in region A with ten in the region opposing the region A with the center of the fly eye lens 7 between them (on the left side in the sheet plane of the drawing), is different from a number of light source images contributing to formation (resolution) of the horizontal pattern, twenty eight in total of addition of fourteen in region B with fourteen on the opposite side (on the upper side in the sheet plane). Then, a replication image of the reticle pattern 14c as shown in FIG. 9B inevitably has an image light amount (that is, line width) of the vertical pattern different from that of the horizontal pattern.

Figure 2A:
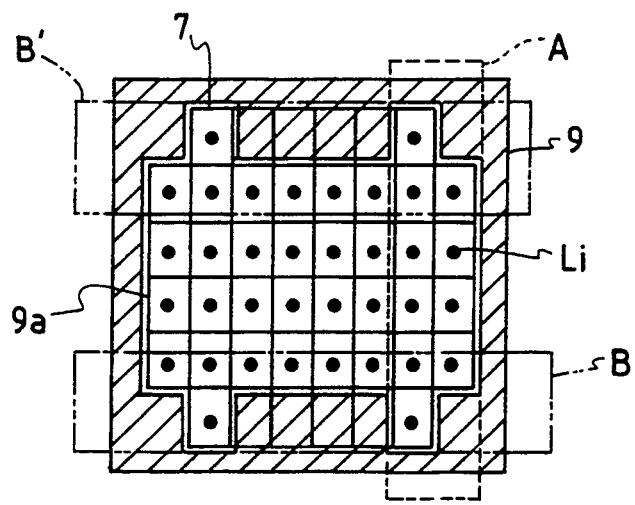
FIG. 2A is a drawing to show a constitution of a σ stop in the first embodiment of the present invention.
Figure 2B:
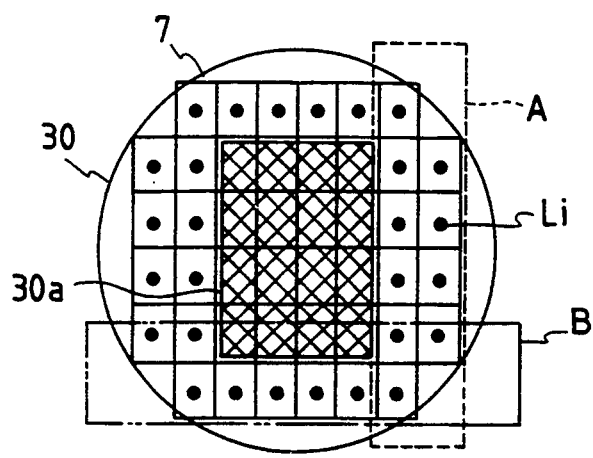
FIG. 2B is a drawing to show a construction of an annular zone stop in the first embodiment.

The stop member is now described in detail in the first embodiment of the present invention, referring to FIG. 2A and FIG. 2B. The construction (arrangement) of the fly eye lens 7 as shown in either of FIG. 2A and FIG. 2B is the same as that as shown in FIG. 6.

A $\sigma$ stop is first described referring to FIG. 2A. The $\sigma$ stop in FIG. 2A is the same as the stop 9 as shown in FIG. 1. In the stop 9 as shown in FIG. 2A, four light source images Li in each region B (eight in total), which could contribute to the formation of the horizontal pattern, are shielded as compared to the stop 25 in FIG. 6. As a result, a number of light source images in region A (broken line) and a number of light source images in region B (alternate long and two short dashes line) both are ten in each peripheral region of the light transmitting portion 9a, whereby no difference in line width is caused between the vertical pattern and the horizontal pattern. Further, the aperture shape of the stop 9 (the light transmitting portion 9a) follows the shape of the elements in the fly eye lens 7. In other words, a boundary (edge) between the light shielding portion (hatched portion) and the light transmitting portion 9a in the stop 9 is aligned with the border line between the elements.

Figure 11A:
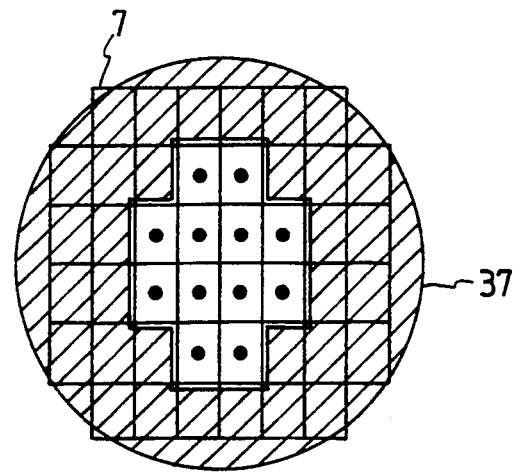
FIG. 11A and FIG. 11B are drawings to show examples of construction of o stop applicable to the apparatus of FIG. 1.

In FIG. 2A, the light source images, which could contribute to the formation of the horizontal pattern, include those in region B and also in region B' (on the upper side in the sheet plane of the drawing), which is symmetric with region B with respect to the center of the fly eye lens 7. Four light source images in region B' are also shielded, so that ten light source images are left in region B'. It is preferable that the number of shielded light source images in region B be the same as that of shielded light source images in region B' and that positions of the shielded light source images in respective regions be symmetric with each other with respect to the center of the fly eye lens 7. This is also the case as to region A, so that the shape of the stop 9 is vertically and horizontally bisymmetrical on the sheet plane of FIG. 2A. The stop 9 may be a metal plate with an opening formed by etching or the like, or a transparent substrate (glass substrate such as quartz) with a light shielding layer formed of chromium or the like. In addition to the stop 9 in FIG. 2A, the G stop may be a stop 37 or 38 as shown in FIG. 11A or in FIG. 11B. Incorporating them into the holding member 10, the $\sigma$ value of the illumination optical system may be readily changed. Conditions for forming the stop 37, 38 are the same as those for the stop 9.

An annular zone stop is next described with reference to FIG. 2B. In FIG. 2B, a stop 30 has a rectangular light shielding portion 30 around the center of the fly eye lens 7 (the optical axis of the illumination optical system), in which there are sixteen lens elements (light source images Li) of four in each column by four in each row shielded. The light shielding portion 30a has a shape which follows the border between the lens elements in the fly eye lens 7. A number of light source images in region A effective to form the vertical pattern and a number of light source images in region B effective to form the horizontal pattern both are ten (twenty in total). Consequently, there is no difference in line width caused between the vertical pattern and the horizontal pattern. In contrast, a conventional annular aperture stop 26 as shown in FIG. 10A has eight light source images in region A and ten light source images in region B with a circular light shielding portion 26a, which would cause a difference in line width between the vertical pattern and the horizontal pattern. Incidentally, improvements in resolution and in focal depth can be achieved in the annular zone illumination method by shielding illumination beams near the optical axis in the exit plane of the fly eye lens 7 (near optical Fourier transform plane of the reticle pattern). Thus, using the stop 30 as shown in FIG. 2B, the improvements in resolution and in focal depth may be also attained in the same manner as in the conventional annular zone stop.

Another conventional annular zone stop 27 as shown in FIG. 10B could have some light source images of lens element overlapping the border between the annular shielding portion 27a and the light transmitting portion, depending upon its diameter (an inner diameter and an outer diameter of the annular light transmitting portion). Then, the illuminance on the reticle surface could largely vary because of a slight deviation of the annular zone stop 27 depending upon the mounting (setting) accuracy of the annular zone stop 27 relative to the fly eye lens 7, which makes a control of exposure difficult. This problem could be also caused with the annular stop 25 as shown in FIG. 6, but could be relaxed to some extent by the averaging effect with more lens elements (light source images) in the light transmitting portion in the circular stop 25. The annular zone stop 27 of FIG. 10B, however, has a considerable number of lens elements covered (shielded) by the circular light shielding portion 27a, being sensitive to the mounting accuracy.

As described above, either one of the σ stop and the annular zone stop as shown in FIG. 2A and FIG. 2B, respectively, has the light shielding portion shaped to follow the shape of the lens elements, so that no light source images by the lens elements overlap any part on the border between the light shielding portion and the light transmitting portion. Even if the accuracy of mounting the stop relative to the fly eye lens 7 were poor, no variation of illumination would be observed on the reticle surface, and in case of arrangement of exchanging plural stops a time for exchange could be reduced. The size of the light shielding portion (or the light transmitting portion), that is, a number of light source images to be shielded, may be uniquely determined depending upon the σ value or the annular zone ratio (a ratio of inner diameter to outer diameter).

The first embodiment as described above employed the fly eye lens composed of rectangular lens elements of eight columns by six rows, but the shape and the arrangement of fly eye lens, and the shape of each lens element may be arbitrary. Also, the shape of the stop (the shielding portion or the light transmitting portion) may be any different from those as shown in FIG. 2A and in FIG. 2B, as far as the stop is shaped to follow the arrangement and shape of the elements (the border between the elements) in the fly eye lens. The stop may be located at a position other than the proximity of the exit plane of the fly eye lens 7, though the position is not shown in FIG. 1. For example, the stop may be positioned in the vicinity of a plane conjugate with the exit plane (an optical Fourier transform plane of the reticle pattern). The stop may be also situated near the entrance side plane of the fly eye lens 7. The vertical pattern or the horizontal pattern may be a pattern other than the periodic pattern, for example an isolated pattern.

Figure 3:
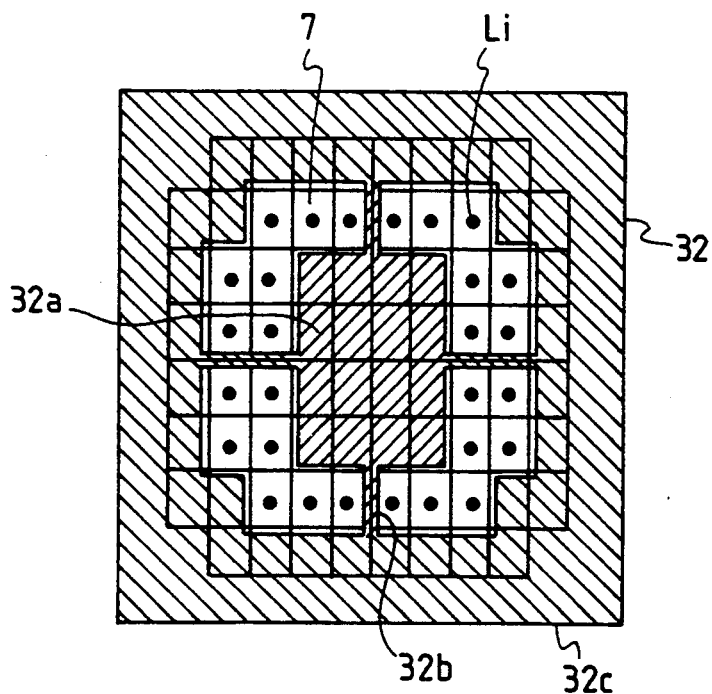
FIG. 3 and FIG. 4 are drawings to show other examples of the annular zone stop as shown in FIG. 2B.

Since the annular zone stop 30 as shown in FIG. 2B has the light shielding portion 30a to shield the illumination beams in the vicinity of the optical axis, the stop is a transparent substrate (glass substrate such as quartz) with the light shielding portion 30a formed thereon of chromium. Alternatively, another stop 32 may be a metal plate hollowed by etching through four light transmitting portions (openings), as shown in FIG. 3. The stop 32 is so arranged that the light shielding portion 32a for shielding the illumination beams near the optical axis is connected and fixed through four supporting portions 32b to a stop main body (light shielding portion 32c). The support portions 32b are also formed to follow the arrangement (shape) of lens elements in the fly eye lens 7 so as not to overlap (shield) the light source images Li. Further, the light shielding portion 32c defining the outer diameter of annular opening is also shaped to follow the shape of lens elements so as not to overlap the light source images on the boundary at each opening, in the same manner as the light shielding portion 32a defining the inner diameter of annular aperture (corresponding to the light shielding portion 30a of the stop 30 in FIG. 2B). In the stop 32, the number of light source images contributing to formation of the vertical pattern and the number of light source images contributing to formation of the horizontal pattern both are ten (twenty in total). Preparing a plurality of stops different in size of the light shielding portions 32a, 32c from one another and properly exchanging the stop to change the number of light source images Li shielded thereby, the inner diameter, the outer diameter, and the value corresponding to the annular zone ratio may be adjusted in the annular zone illumination method.

Figure 4:
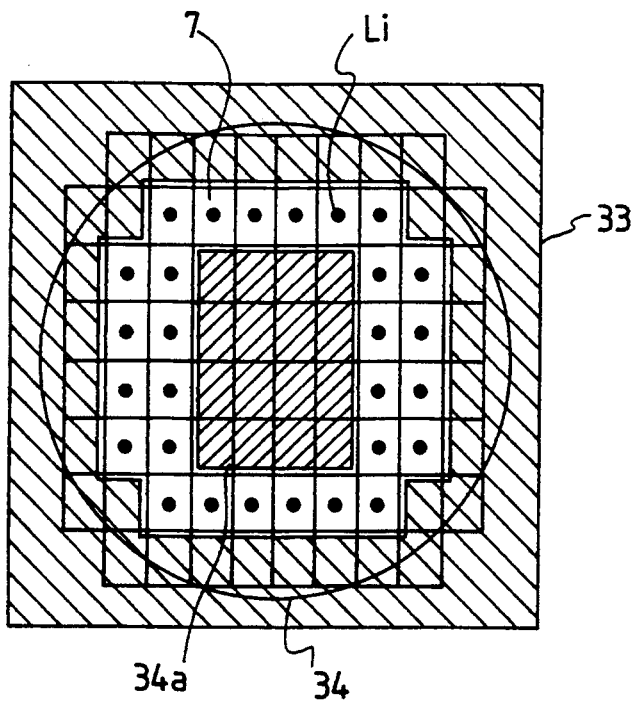

A single stop was used for annular zone illumination in each example of FIG. 2B and FIG. 3, but two stops 33, 34 as shown in FIG. 4 may be located very closely to each other so as to achieve the annular zone illumination by overlap of light shielding portions of the stops. Conditions to form the stops 33, 34 are the same as those for the stops 30, 32, so that the light shielding portions are formed to follow the shape of elements so as not to overlap the light source images on the boundary between the light shielding portions and the light transmitting portion. The stop 33 defines the outer diameter of annular zone illumination and the stop 34 does the inner diameter thereof, as being formed to follow the shape of lens elements. The outer diameter stop 33 has a large opening inside thereof, and the inner diameter stop 34 has the light shielding portion 34a for shielding the illumination beams near the optical axis. The stops 33, 34 may be separately located, one near the exit plane of the fly eye lens 7 and the other near a plane conjugate therewith. A number of stop segments may be three or more. Arranging the stops 33 and 34 exchangeable independent of each other can make the inner diameter, the outer diameter, and the annular zone ratio of the annular zone illumination readily adjusted.

Figure 5:
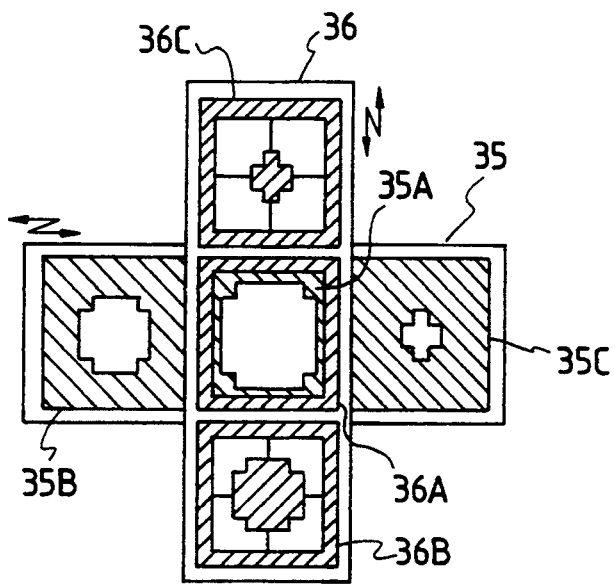
FIG. 5 is a drawing to show an example of stop exchanging mechanism suitable for the apparatus of FIG. 1.

The stop exchanging mechanism may employ any method, for example a method using a turret plate with plural stops fixed thereto in which the stops may be exchanged one for another by rotating the turret plate, or an exchange method using a slider as shown in FIG. 5. In FIG. 5, two sliders 35, 36 are disposed close to each other, and three stops 35A–35C on the slider 35 are σ stops or outer diameter stops for annular zone illumination. Further, a stop 36A on the slider 36 can transmit all light source images formed by the entire lens elements in the fly eye lens 7 through the light transmitting portion, and remaining two stops 36B, 36C are inner diameter stops for annular zone illumination. For example, the σ value of the illumination optical system may be changed by combining the stop 36A with each of the stops 35A–35C, while the inner diameter and the outer diameter (and the annular zone ratio) of annular zone illumination may be readily changed by combining the stop 35B with each of the stops 36B and 36C. The number of stops fixed to a single slider may be arbitrary. The stop exchanging mechanism of this type may be made smaller, as compared to the arrangement using the turret plate, in such an arrangement that the number of stops are limited to two or three, that the number of sliders are increased in case of shortage of number of stops, and that the sliders may be located close to each other on the exit plane of the fly eye lens 7 or separate from each other, one on the exit plane and the other on the plane conjugate therewith. The stops fixed on the slider may be the stops as shown in FIG. 2A, FIG. 2B, and FIG. 3.

Figure 12:
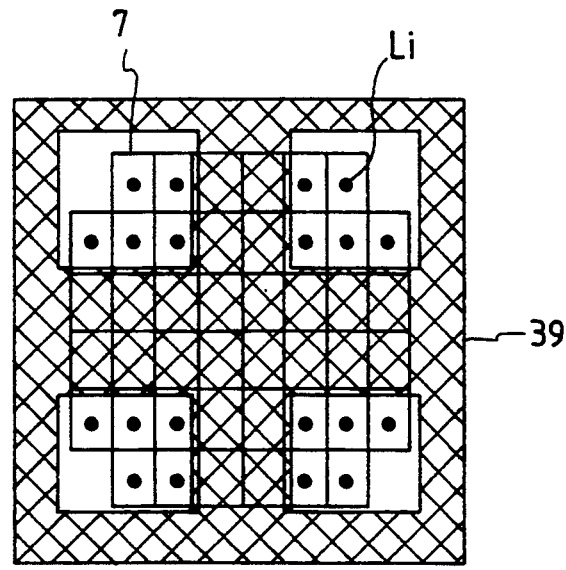
FIG. 12, FIG. 13A, and FIG. 13B are drawings to respectively show examples of construction of modified light source stop in the first embodiment.
Figure 13A:
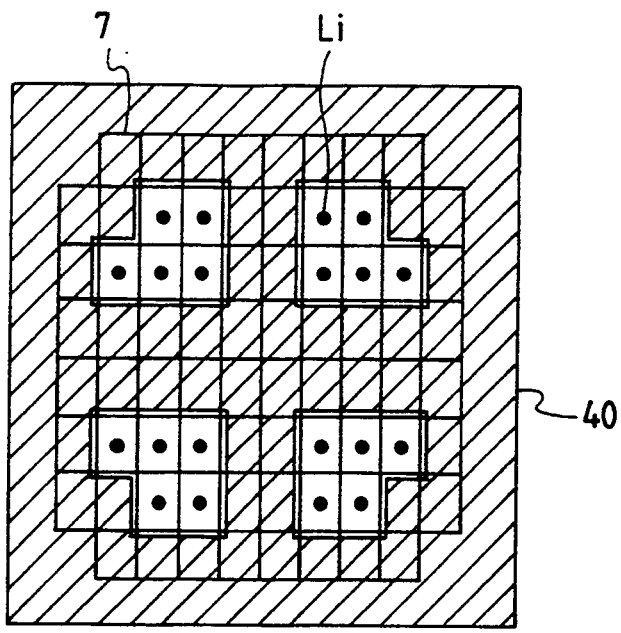

The first embodiment as described was explained in applications of the present invention to the annular zone stop and to the σ stop, but it should be noted that the present invention may be applicable for example to a modified light source stop transmitting the illumination light only through four regions $D_{VH}$ as shown in FIG. 9A while enjoying the same advantages. The modified light source stop can permit exposure with a higher resolution and a greater focal depth as compared to the annular zone illumination. An example of the modified light source stop is shown in FIG. 12. FIG. 12 shows a stop 39, in which a light shielding portion is formed to follow the shape or arrangement of elements so as not to overlap the light source images Li on a boundary between a light shielding portion and a light transmitting portion. In the modified light source stop 39 of FIG. 12, a number of light source images contributing to formation of the vertical pattern and a number of light source images contributing to formation of the horizontal pattern both are ten (twenty in total). FIG. 13A shows another stop 40 similar to the stop in FIG. 12, in which respective light transmitting portions are formed to follow the shape of elements over the entire area.

Figure 13B:
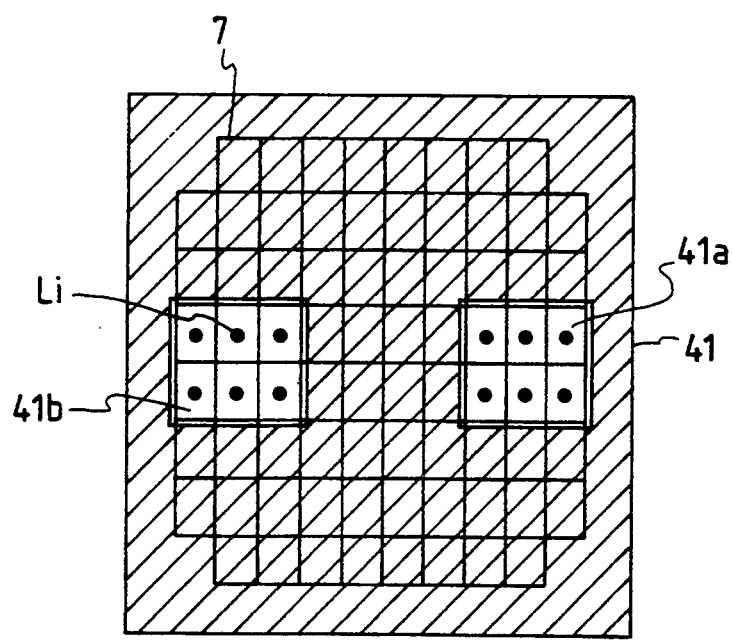

Respective center positions of the four light transmitting portions, more precisely barycenter positions of light amount distribution with plural light source images in the light transmitting portions, are equally distant from the optical axis AX of the illumination optical system (the center of the fly eye lens 7). A distance between a barycenter position of light amount distribution in each light transmitting portion and the optical axis AX of the illumination optical system is determined depending upon the degree of fineness (line width, pitch, or the like) of the reticle pattern. It is preferable in the inclined illumination method that a plurality of stops (39, 40, etc.) different in the distance from each other be prepared and an optimum stop for fineness degree of reticle pattern be located in the optical path. The stops 39, 40 are especially effective in a case that the reticle pattern includes a two-dimensional periodic pattern or in case that the reticle pattern includes a vertical pattern and a horizontal pattern. In case of a one-dimensional periodic pattern, a stop 41 may be employed with two transmitting portions 41a, 41b arranged corresponding to the period direction as shown in FIG. 13B. This stop 41 is the same as that in FIG. 1.

Figure 11B:
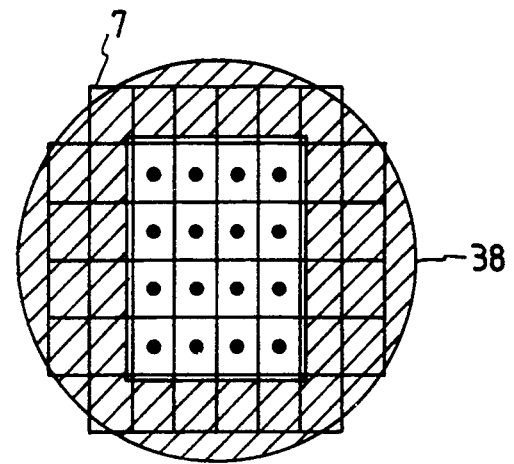
Figure 14:
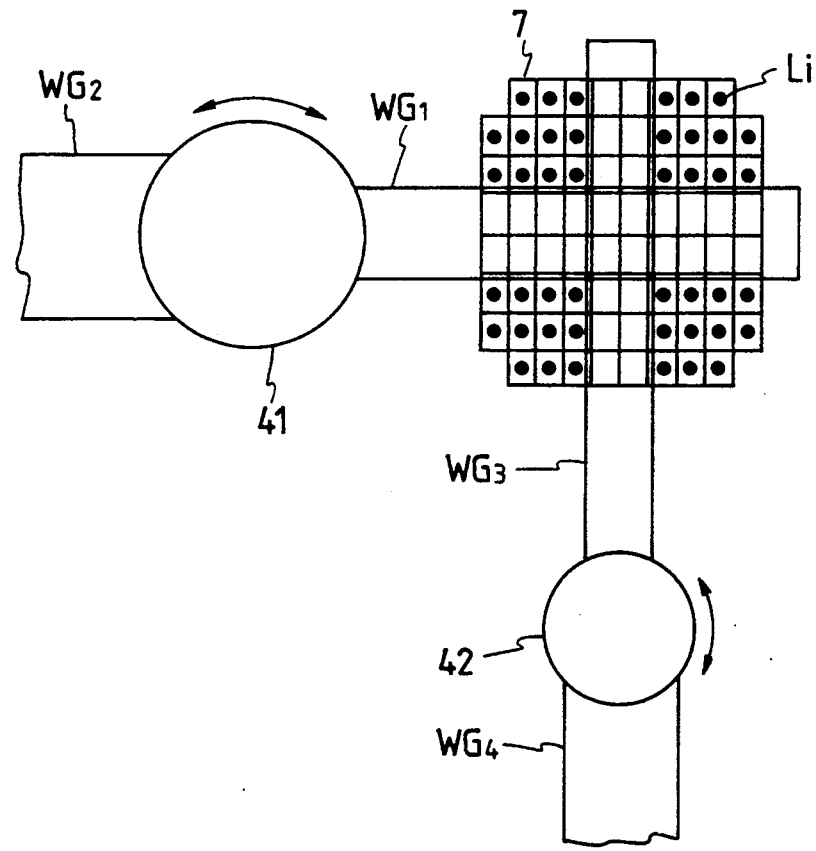
FIG. 14 is a drawing to show a modification of the modified light source stop of FIG. 12.

In place of the stops 39, 40, two shielding wings as shown in FIG. 14 may be combined to form a stop. In FIG. 14, rotating members 41, 42 have plural (two in FIG. 14) shielding wings $WG_1$, $WG_2$ and wings $WG_3$, $WG_4$, respectively, which are different in shielding width from each other. Combining these shielding wings, the number of light source images formed by the lens elements may be changed and the barycenter positions of the four light transmitting regions (light amount distributions) may be changed relative to the optical axis of the illumination optical system. The above arrangement permits no light source images to be shielded outside the fly eye lens 7, and it is, therefore, preferable that a stop for defining an outer diameter (for example the stop 9, 37, 38 as shown in FIG. 2A, FIG. 11A, or FIG. 11B) be placed near the exit plane of the fly eye lens 7.

The same shielding as with the stops 39, 40 (or stop 41) may be effected by combining the stop as shown in FIG. 2B, FIG. S, or FIG. 4 with a stop having a light shielding portion of cross (or H shape) with center on the optical axis of the illumination optical system. Further, a plurality of σ stops (9, 37, 38) may be exchangeably arranged to change the σ value thereof near four (or two) exit planes of fly eye lens.

Figure 15:
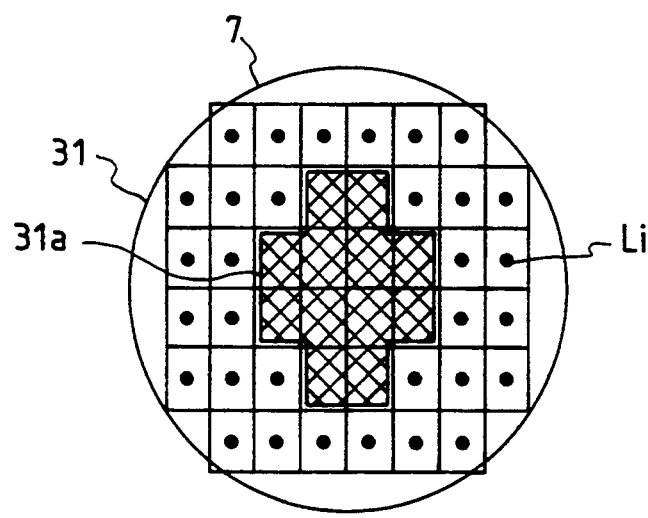
FIG. 15 is a drawing to show a modification of the annular zone stop of FIG. 2B.

The above embodiment may employ an annular zone stop 31 as shown in FIG. 15. The annular zone stop 31 shields twelve lens elements (light source images Li) by its light shielding portion 31a of cross, and a shape of the light shielding portion 31a is determined as to follow a boundary between lens elements in the fly eye lens 7. In the annular zone stop 31, the number of light source images contributing to formation of the vertical pattern is different from that of light source images contributing to formation of the horizontal pattern. Thus, there could be a difference in line width between the vertical pattern and the horizontal pattern depending upon the reticle pattern, but there could be enjoyed an advantage of decreasing the light amount loss or the illuminance evenness degradation, as compared to the annular zone stop 30 of FIG. 2B.

In case that the number of effective lens elements (light source images Li), not shielded by the stop, is extremely reduced by the stop member, the arrangement of the fly eye lens is to be fit to the light transmitting portion. For example, optimizing an arrangement of lens elements constituting the fly eye lens 7, that is even arrangement or odd arrangement, the number of light source images (secondary light source images) effective to the vertical pattern may be made equal to that of light source images effective to the horizontal pattern. In optimizing the arrangement of lens elements, the parity (even arrangement or odd arrangement) in the vertical direction is not necessarily equal to that in the horizontal direction.

In the examples as described, the respective stop light shielding portions (30a–32a, 34a, etc.) may be formed as a light reducing portion. Also, the stop member in the first embodiment may be replaced by a variable stop using a liquid crystal display device or an electrochromic device. Further, FIG. 1 shows an example in which the modified light source stop 41 and the σ stop 9 are arranged as exchangeable, but any stops may be set on the holding member 10.

The second embodiment according to the present invention will be next explained. A projection type exposure apparatus in the present embodiment has substantially the same construction as in the first embodiment as shown in FIG. 1 except for a shape of stop member disposed near the exit plane of the fly eye lens 7. The present embodiment assumes employment of the modified light source method, in which a modified light source stop 8 is provided near the exit plane of the fly eye lens 7. As for the following embodiments, the description will be focused mainly on the construction of modified light source stop. The modified light source stop 8 of the present embodiment has four light transmitting portions (8a–8d), details of which will be described later.

Figure 16A:
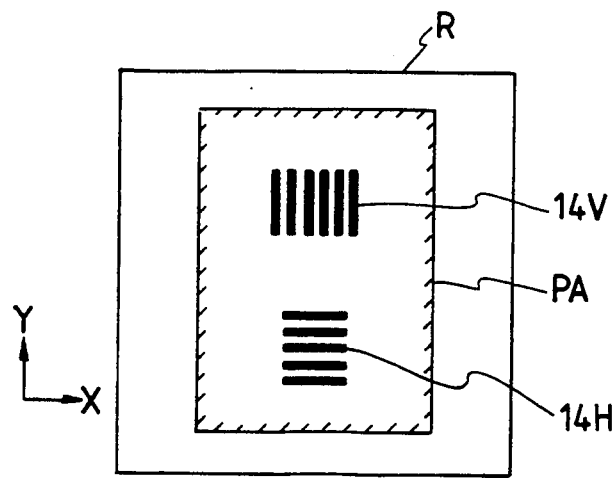
FIG. 16A is a drawing to show an example of construction of reticle used in the apparatus of FIG. 1.

FIG. 16A shows a scheme of a reticle R used in the present embodiment. An effective area (pattern area) PA in the reticle R is rectangular to match with a shape of semiconductor integrated circuit. In this example, the reticle pattern 14 includes a vertical pattern 14V (a periodic pattern arranged in the X direction) and a horizontal pattern 14H (a periodic pattern arranged in the Y direction).

Figure 16B:
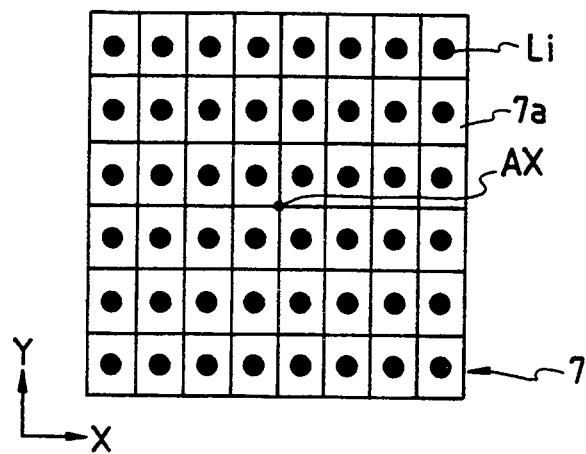
FIG. 16B is a drawing to show a construction of fly eye lens used in the second and the third embodiments according to the present invention.

FIG. 16B shows an example of fly eye lens 7 effective to uniformly illuminate the reticle R, that is, the rectangular effective area PA, specifically an example of shape of exit plane, each lens element 7a being rectangular as similar to the effective area PA. A black dot Li in the central area of each element 7a represents an image (secondary light source) of the light source 1 formed by each element. The entrance plane of the fly eye lens 7 is identical in shape with the exit plane, but an illuminance distribution is substantially uniform on the entrance plane. Illumination light beams output from the respective elements 7a are superimposed on the effective area PA while making the illuminance uniform on the pattern surface. The entrance plane of the fly eye lens 7 is in imaging relation with the reticle pattern surface as described before. Thus, if the shape of the lens elements 7a in the fly eye lens 7 is similar to that of the effective area PA, the reticle R could be illuminated at the highest efficiency in respect of light amount.

In the discrete secondary light source distribution as shown in FIG. 16B, light source images Li near the optical axis AX of the illumination optical system are light sources unfavorable in respect of resolution and focal depth of the projection optical system. A light source image Li distant from the optical axis AX is also unfavorable for a pattern in a specific direction in respect of focal depth. This reported in "New Imaging Technique for 64M DRAM", '92 SPIE Optical/Laser Microlithography V Vol. 1674-63.

Figure 19:
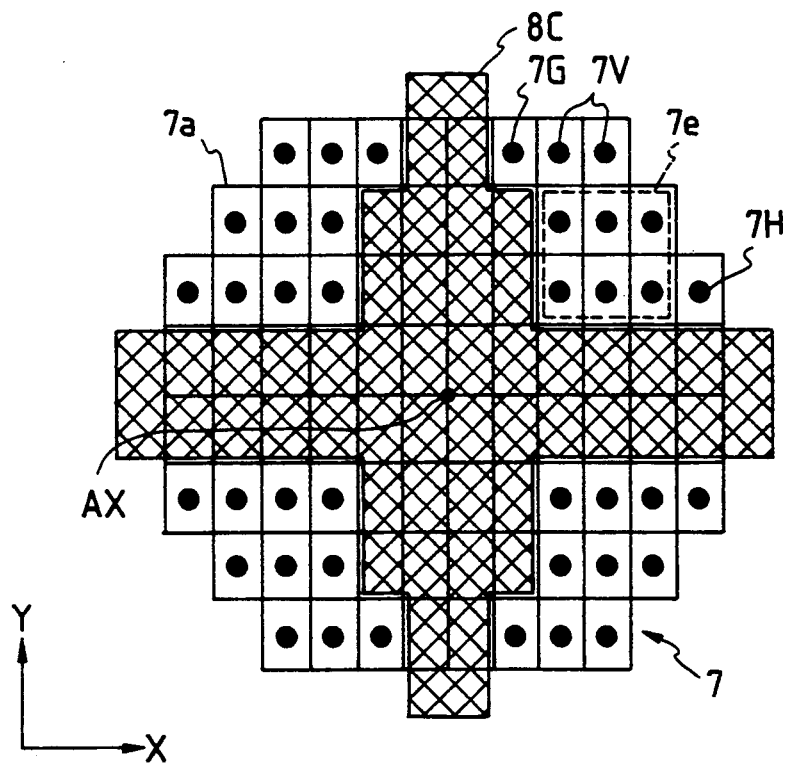
FIG. 19 is a drawing to show a construction of the modified light source stop in the third embodiment of the present invention.
Figure 20A:
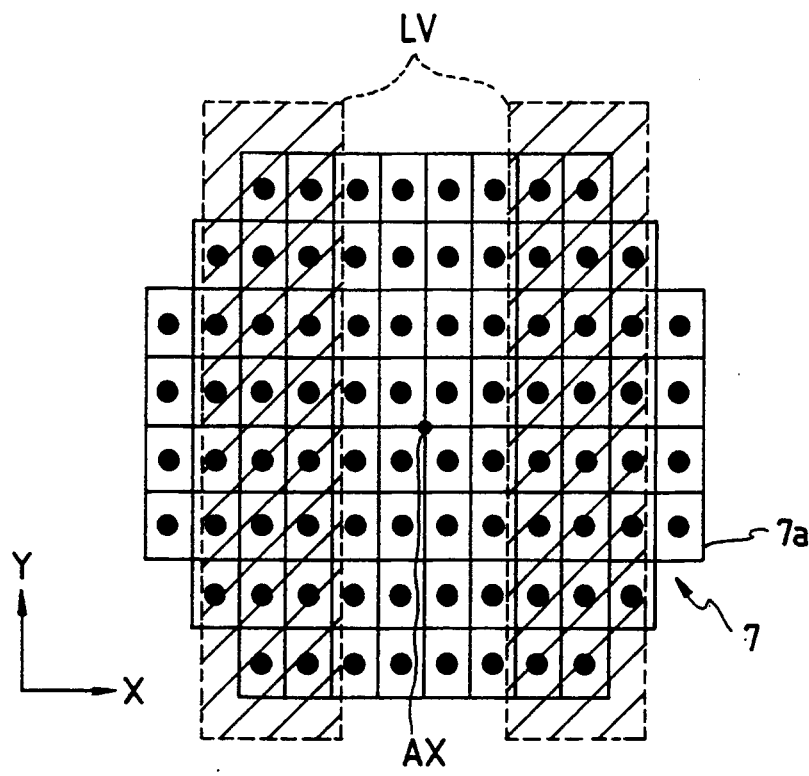
FIG. 20A and FIG. 20B are drawings to illustrate fundamentals of the second embodiment according to the presents invention.
Figure 20B:
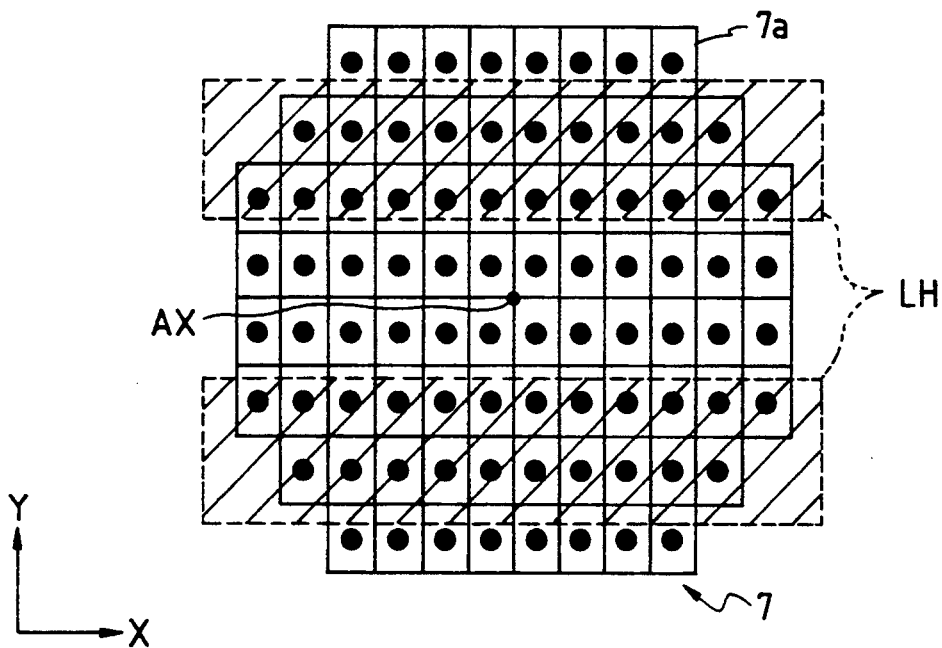

For example, secondary light source images (black dots) in two regions (hatched portions) LV as shown in FIG. 20A are especially effective in respect of focal depth for the vertical pattern 14V in FIG. 16A. Further, secondary light source images (black dots) in two regions (hatched portions) LH as shown in FIG. 20B are especially effective in respect of focal depth for the horizontal pattern 14H. Positions of the regions LV, LH differ depending upon a pitch of pattern. FIG. 20A and FIG. 20B both show the exit plane of the fly eye lens, in which the shape and arrangement of fly eye lens (for example the number of lens elements) are different from those of FIG. 16B but are identical in directionality (in rotational position in the sheet plane of the drawings) therewith. This is also the case in each fly eye lens as described below with FIG. 17, FIG. 18, or FIG. 19.

Since an actual reticle pattern includes a lot of vertical patterns and horizontal patterns, the secondary light source should be selected in regions favorable for both the vertical patterns and the horizontal Hausler. This means that common regions should be selected in the regions LV and LH. However, if the secondary light source is selected in the above method, a number of secondary light source images (number of effective lens elements) would be decreased, causing an extreme decrease of illumination light amount or degradation of illuminance evenness on the reticle surface.

Figure 17:
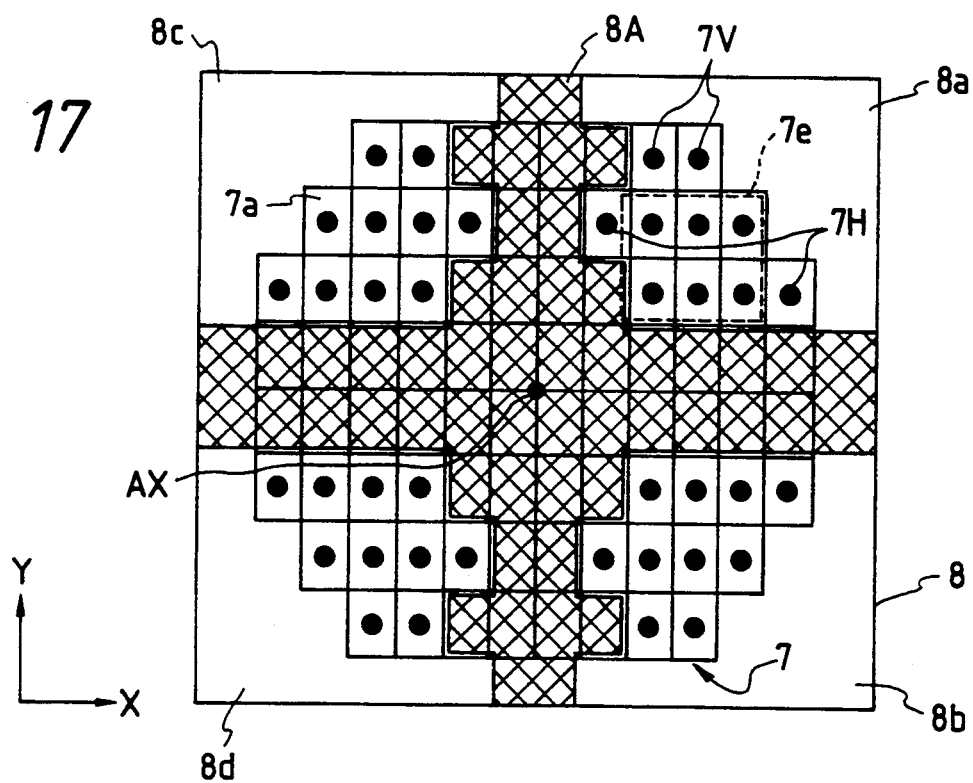
FIG. 17 is a drawing to show a construction of modified light source stop in the second embodiment.

FIG. 17 shows a specific construction of the modified light source stop 8 in the second embodiment according to the present invention. In FIG. 17, a hatched portion 8A represents a light shielding portion. In the example of FIG. 17, all secondary light source parts (corresponding to the overlap portions in the regions LV and LH in FIG. 20A and FIG. 20B) effective to both the vertical pattern and the horizontal pattern are made to be light transmitting portions, and several secondary light source images (lens elements) especially effective only to either one of the vertical pattern and the horizontal pattern are also made to be light transmitting elements.

Observing one light transmitting portion 8a in FIG. 17, six secondary light source images in a broken line 7e are light sources effective to both the vertical pattern and the horizontal pattern. Also, two secondary light source images 7V are effective only to the vertical pattern 14V in respect of focal depth, and two secondary light source images 7H are light sources effective only to the horizontal pattern 14H in respect of focal depth. This is also the case in each of other three light transmitting portions 8b, 8c, 8d.

Regarding the vertical pattern, secondary light source images of $(6+2) \times 4 = 32$ are effective but secondary light source images (7H) of $2 \times 4 = 8$ are not so effective in respect of focal depth. As for the horizontal pattern, secondary light source images of $(6+2) \times 4 = 32$ are effective but secondary light source images (7V) of $2 \times 4 = 8$ are not so effective in respect of focal depth. In other words, a ratio of number of effective secondary light source images to number of noneffective secondary light source images in respect of focal depth for the vertical pattern is equal to that for the horizontal pattern. In the above arrangement with use of the modified light source stop (8A) as shown in FIG. 17, a modified light source may be achieved with a sufficiently greater focal depths substantially equal to each other for the vertical pattern and for the horizontal pattern while preventing a loss of illumination light amount and degradation of illuminance evenness.

In summary, the modified light source stop in the present embodiment is so arranged that the number of secondary light source images effective only to one of the vertical pattern and the horizontal pattern is made identical with the number of secondary light source images effective only to the other. For example, the secondary light source images effective only to the vertical pattern (that is, secondary light source images not so effective to the horizontal pattern) may be preferably split into two as same in number (four each in the present embodiment) left and right on the sheet plane of the drawing with respect to the optical axis AX. This is also the case as to the horizontal pattern.

The modified light source stop (light shielding portion 8A) as shown in FIG. 17 is shaped to follow the arrangement (shape) of the respective lens elements 7a in the fly eye lens 7. In detail, the border (edge) between the light shielding portion 8A and the light transmitting portions is substantially coincident with the boundary lines between the elements. In other words, the modified light source stop (light shielding portion) is so arranged that the edge does not fall on any of the discrete secondary light source images. This is for avoiding a change in illumination properties (variation of illumination light amount or the like) which could be caused by a deviation of setting position of aperture stop upon exchange of aperture stop in the apparatus provided with the exchanging mechanism of aperture stop as described in FIG. 1. For this, in the present embodiment, the vertical and horizontal lengths of the light shielding portion 8A are approximately twice as long as the corresponding lengths of the lens element 7a, as shown in FIG. 17. Since the secondary light source images (lens elements) are shielded, two in the vertical direction and two in the horizontal direction, the light shielding width is determined as to be the double of element width. The light shielding width, however, may be normally determined as to be n times (n:integer) as wide as the width of lens elements to be shielded.

A reticle (real reticle) actually used in the projection type exposure apparatus is not always comprised of X direction pattern and Y direction pattern at a certain pitch, but has a pattern at coarse pitches and fine pitches mixed therein. It is difficult with such a real reticle to determine an exact shape of secondary light source (the number and the position of light source images) suitable for the horizontal pattern and the vertical pattern in the method as described. It is because the optimum shape of secondary light source differs depending upon the patterns different in pitch from each other in the real reticle.

The second embodiment as described concerns the method of matching (equalizing) the numbers of secondary light source images respectively effective to the vertical pattern and to the horizontal pattern with each other, while the third embodiment of the present invention as will be described below concerns a method of having equal contribution from all secondary light source images to respective increases of focal depth in the X direction pattern and in the Y direction pattern on the real reticle. The present embodiment also assumes the employment of the modified light source stop (light shielding portion 8A) as shown in FIG. 17.

A rectangular coordinate system XY is set with coordinate origin on the optical axis AX in the present embodiment, and the following description is focused on lens elements in a light transmitting portion 8a out of the entire lens elements in FIG. 17. The size of each lens element is determined as six units in the horizontal (X) direction and eight units in the vertical (Y) direction, where the unit is arbitrary. Coordinates of ten secondary light source images in the light transmitting portion are given by combinations of the following coordinates on the rectangular coordinate system XY:

X=9, 15, 21, 27, 33;
Y=12, 20, 28.

For example, the two secondary light source images 7H take coordinates (9, 20) and (33, 12).

The barycenter of ten secondary light source images (light amount distribution) in the light transmitting portion 8a may be calculated as a coordinate (20.4, 18.4). Namely, the ten secondary light source images can uniformly increase the focal depth for both the X direction pattern and the Y direction pattern as a whole (as the barycenter of light amount). Although the above description concerns only the light transmitting portion 8a, the same arrangement is effected on either of remaining three light transmitting portions 8b, 8c, 8d.

As described, in the present embodiment, a difference between the X coordinate (absolute value) and the Y coordinate (absolute value) of the light amount barycenter of each light transmitting portion is preferably zero or within about ten percent of the absolute value of the X coordinate (or the Y coordinate) as in the above example. As so arranged, the present embodiment can permit uniform increase of focal depth for the X direction pattern and for the Y direction pattern while preventing a loss of illumination light amount and degradation of illuminance evenness. Since this embodiment was explained using the modified light source filter in the second embodiment as shown in FIG. 17, the number of secondary light source images effective to the vertical pattern is the same as that of secondary light source images effective to the horizontal pattern. However, the numbers of secondary light source images effective to the vertical pattern and to the horizontal pattern do not always have to be equal to each other in the present embodiment. The essence is that the above difference of X, Y coordinates is set to zero or about ten percent.

As the vertical pattern and the horizontal pattern are made finer on the reticle, the effective regions to increase the focal depth in the secondary light source (the barycenter position of light amount distribution of light transmitting portion) are shifted toward the outside of the regions LV, LH as shown in FIGS. 20A and 20B (in the direction away from the optical axis AX). In such a case, a modified light source stop (light shielding portion 8C) as shown in FIG. 19 may be employed to transmit light of secondary light source images outside of the modified light source stop (8A) of FIG. 17. If the pattern has coarse horizontal and vertical patterns, a modified light source stop (light shielding portion 8B) as shown in FIG. 18 may be employed to transmit light of secondary light source images inside of the modified light source stop (8A) of FIG. 17.

Figure 18:
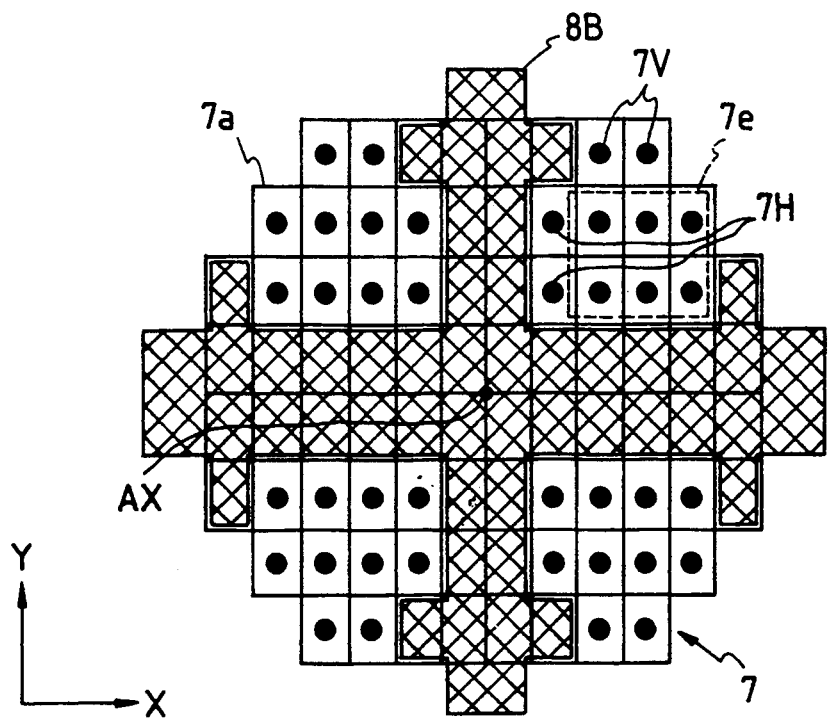
FIG. 18 is a drawing to show a modification of the modified light source stop of FIGS. 16A and 16B.

The modified light source stop 8B as shown in FIG. 18 is so arranged in the same manner as in the second embodiment that the number of secondary light source images effective to the vertical pattern is equal to that of secondary light source images effective to the horizontal pattern. Observing the right upper portion (corresponding to a light transmitting portion), secondary light source images effective to the vertical pattern include six in a broken line 7e and two secondary light source images 7V, eight in total, while secondary light source images effective to the horizontal pattern do six in the broken line 7e and two secondary light source images 7H, eight in total. The light amount barycenter calculated is at coordinate (18.0, 18.4).

A modified light source stop 8C as shown in FIG. 19 is an example of stop in the third embodiment. Observing the right upper portion of FIG. 19, secondary light source images effective to the vertical pattern include six in a broken line 7e and two secondary light source images 7V, eight in total, while secondary light source images effective to the horizontal pattern do six in the broken line 7e and a secondary light source image 7H, seven in total. In other words, the number of secondary light source images effective to the vertical pattern is not equal to that for the horizontal pattern. Further in FIG. 19, a secondary light source image 7G is present, which is not so effective to either of the vertical pattern and the horizontal pattern. However, the light amount barycenter calculated for the right upper portion of FIG. 19 is at coordinate (20.4, 19.2). Namely, a difference of absolute value between the X coordinate and the Y coordinate falls within about ten percent of the X coordinate (or the Y coordinate), so that the X coordinate and the Y coordinate of the light amount barycenter are approximately equal to each other. With a real reticle having patterns with various pitches, the focal depth may be uniformly increased in practical use for X direction pattern and Y direction pattern while minimizing the light amount loss and the degradation of illuminance evenness.

In the second and third embodiments as described, looking at one of the light transmitting portions of the modified light source stop, at least one secondary light source image is selectively used in addition to the secondary light source images effective to both the X direction pattern and Y direction pattern (six images in the broken line 7e in FIG. 17, FIG. 18, or FIG. 19), whereby the light amount loss and the illuminance evenness degradation may be minimized. Especially in the second embodiment, the secondary light source is selected such that the number of secondary light source images effective only to the X direction pattern is made equal to that effective only to the Y direction pattern. In the third embodiment, the number of secondary light source images effective to the X direction pattern is not always equal to that effective to the Y direction pattern, and a secondary light source image not so effective to either of the X direction pattern and the Y direction pattern may be selected to use. Namely, the secondary light source is so selected that the X coordinate (absolute value) of light amount barycenter is made substantially equal to the Y coordinate (absolute value) thereof. This permits attainment of modified light source substantially equally and sufficiently increasing the focal depth for each of the X direction pattern and the Y direction pattern. There is no difference in line width caused in the X direction pattern and in the Y direction pattern in a replication image.

The modified light source stop is positioned on the exit side focal plane of the fly eye lens 7 in the second and third embodiments, but it may be located at another position, for example near a plane conjugate with the focal plane (optical Fourier transform plane of reticle pattern). Also, the modified light source stop may be situated near the entrance plane of the fly eye lens 7 (a plane substantially conjugate with the reticle pattern). Further, the light shielding portion (8A and others) in the modified light source stops may be formed as a light reducing portion. Moreover, the modified light source stop may be a variable stop using a liquid crystal display device or an electrochromic device.

Only a set of fly eye lens is arranged in the apparatus of FIG. 1, but two sets of fly eye lens as disclosed for example in Japanese Laid-open Patent Application No. 63-66553 may be arranged in series in the apparatus. In this case, the stop member in each of the embodiments according to the present invention may be placed on either the entrance plane or the exit plane of a first stage (light source side) fly eye lens or of a second stage (reticle side) fly eye lens. In case that a modified light source filter is located near the exit plane of the second stage fly eye lens, a plurality (corresponding to the number of lens elements in the 1st stage fly eye lens) of tertiary light source images are formed on respective exit planes of lens elements and shielded (or reduced) in element unit in the same manner as in the embodiments as described above.

Further, there was no light shielding portion for defining an outer diameter of the fly eye lens (outer diameter stop) shown in the above embodiments, but the outer diameter stop may be arranged to shield stray light. The outer diameter stop is preferably formed such that the edge of light shielding portion follows the arrangement of lens elements. The light shielding portion could be so arranged as to shield some of secondary light source images. The exposure light source 1 of the projection type exposure apparatus as shown in FIG. 1 may be a light source other than the mercury lamp, for example, an excimer laser, a metal vapor laser, a YAG laser or the like with harmonics, X rays, etc.

What is claimed is:

1. A projection type exposure apparatus comprising:
   a light source for radiating illumination light for exposure;
   an illumination optical system for irradiating with said illumination light a mask having a first pattern and a second pattern extending perpendicular to each other;
   said illumination optical system having a fly eye type integrator for forming a plurality of images of the light source on or near a Fourier transform plane to a pattern surface of said mask;
   a projection optical system for projecting an image of the patterns of said mask on a photosensitive substrate; and
   a stop member for restricting passage of said illumination light through said Fourier transform plane to an annular zone with center on an optical axis of said illumination optical system and for partially shielding or reducing said plurality of images of the light source such that a number of images of the light source contributing to a resolution of said first pattern is substantially identical with that of images of the light source contributing to a resolution of said second pattern in said annular zone.

2. A projection type exposure apparatus according to claim 1, wherein said stop member has a light shielding or reducing portion shaped to follow an arrangement of optical elements constituting said fly eye type integrator.

3. A projection type exposure apparatus according to claim 2, wherein said stop member is located near an entrance plane, on an exit side focal plane, or on a plane conjugate therewith.

4. A projection type exposure apparatus comprising:
   a light source for radiating illumination light for exposure;
   an illumination optical system for irradiating with said illumination light a mask having a first pattern and a second pattern extending perpendicular to each other;
   said illumination optical system having a fly eye type integrator for forming a plurality of images of the light source on or near a Fourier transform plane to a pattern surface of said mask;
   a projection optical system for projecting an image of the patterns of said mask on a photosensitive substrate; and
   a stop member for restricting passage of said illumination light through said Fourier transform plane to a partial region around an optical axis of said illumination optical system and for partially shielding or reducing said plurality of images of the light source such that a number of images of the light source contributing to a resolution of said first pattern distributed on a periphery of said partial region is substantially identical with that of images of the light source contributing to a resolution of said second pattern distributed on a periphery of said partial region.

5. A projection type exposure apparatus according to claim 4, wherein said stop member has a light shielding or reducing portion shaped to follow an arrangement of optical elements constituting said fly eye type integrator.

6. A projection type exposure apparatus according to claim 5, wherein said stop member is located near an entrance plane, on an exit side focal plane, or on a plane conjugate therewith.

7. A projection type exposure apparatus comprising:
a light source for radiating illumination light for exposure;
an illumination optical system for irradiating with said illumination light a mask having a first periodic pattern and a second periodic pattern extending perpendicular to each other;
said illumination optical system having a fly eye type integrator for forming a plurality of images of the light source on or near a Fourier transform plane to a pattern surface of said mask;
a projection optical system for projecting an image of the patterns of said mask on a photosensitive substrate; and
a stop member for restricting passage of said illumination light through said Fourier transform plane to local regions eccentric to an optical axis of said illumination optical system and for partially shielding or reducing said plurality of images of the light source such that a number of images of the light source contributing to a resolution and a focal depth of said first periodic pattern is substantially identical with that of images of the light source contributing to a resolution and a focal depth of said second periodic pattern in said local regions.

8. A projection type exposure apparatus according to claim 7, wherein said stop member has a light shielding or reducing portion shaped to follow an arrangement of optical elements constituting said fly eye type integrator.

9. A projection type exposure apparatus according to claim 8, wherein said stop member is located near an entrance plane, on an exit side focal plane, or on a plane conjugate therewith.

10. A projection type exposure apparatus according to claim 8, wherein said stop member has four light transmitting portions determined by said light shielding or reducing portion such that barycenters of light amount distribution in said local regions are equally distant from the optical axis of said illumination optical system.

11. A projection type exposure apparatus according to claim 7, wherein said stop member has a light shielding or reducing portion for making a ratio of number of light source images contributing to a focal depth of said first periodic pattern to a number of other light source images substantially equal to ratio of number of light source images contributing to a focal depth of said second periodic pattern to number of other light source images in each of said local regions.

12. A projection type exposure apparatus comprising:
a light source for radiating illumination light for exposure;
an illumination optical system for irradiating with said illumination light a mask having a first periodic pattern and a second periodic pattern extending perpendicular to each other;
said illumination optical system having a fly eye type integrator for forming a plurality of images of the light source on or near a Fourier transform plane to a pattern surface of said mask;
a projection optical system for projecting an image of the patterns of said mask on a photosensitive substrate; and
a stop member for partially shielding or reducing said plurality of images of the light source such that a distribution of light amount from said plurality of images of the light source takes a maximum for each of local regions eccentric to an optical axis of said illumination optical system and that when an XY rectangular coordinate system is set with coordinate origin on the optical axis of said illumination optical system and in said Fourier transform plane, a barycenter of the distribution of light amount in each local region takes X, Y coordinates, absolute values of which are substantially equal to each other, on the XY coordinate system.

13. A projection type exposure apparatus according to claim 12, wherein said stop member has a light shielding or reducing portion shaped to follow an arrangement of optical elements constituting said fly eye type integrator.

14. A projection type exposure apparatus according to claim 13, wherein said stop member is located near an entrance plane, on an exit side focal plane, or on a plane conjugate therewith.

15. A projection type exposure apparatus according to claim 13, wherein said stop member has four light transmitting portions determined by said light shielding or reducing portion such that barycenters of light amount distribution in said local regions are equally distant from the optical axis of said illumination optical system.

16. A projection type exposure apparatus according to claim 12, wherein said stop member has a light shielding or reducing portion for partially shielding or reducing said light source images such that said each local region comprises at least one light source image which is not contributing to the focal depths of said first periodic pattern and said second periodic pattern.

17. A method of exposure in which a first pattern and a second pattern extending perpendicular to each other on a mask are projected for exposure through a projection optical system on a photosensitive substrate, comprising:
positioning a fly eye type integrator for forming a plurality of images of light source on or near a Fourier transform plane to a pattern surface of said mask in an illumination optical system for irradiating said mask with illumination light from the light source; and
shielding or reducing at least one image of the light source located in a periphery of a partial region around on optical axis of said illumination optical system, whereby a number of images of the light source contributing to a resolution or a focal depth of said first pattern is made substantially identical with that of images of the light source contributing to a resolution or a focal depth of said second pattern.

18. A method of exposure according to claim 17, wherein shielded or reduced is illumination light incident into an optical element corresponding to said at least one image of the light source among optical elements constituting said fly eye type integrator.

19. A method of exposure according to claim 17, wherein said at least one image of the light source is shielded or reduced in said Fourier transform plane or on a plane conjugate therewith.

20. A method of exposure in which a distribution of light amount on or near a Fourier transform plane to a pattern surface of a mask in an illumination optical system takes a maximum for each of local regions eccentric to an optical axis of said illumination optical system and in which a first periodic pattern and a second periodic pattern arranged perpendicular to each other on said mask are projected for exposure through a projection optical system on a photosensitive substrate, comprising:

arranging a barycenter of the distribution of light amount in each local region such that when an XY rectangular coordinate system is set with coordinate origin on the optical axis of said illumination optical system and in said Fourier transform plane, absolute values of X, Y coordinates of said barycenter are substantially equal to each other.

* * * * *